US008968532B2

(12) United States Patent  
Puch

(10) Patent No.: US 8,968,532 B2  
(45) Date of Patent: Mar. 3, 2015

(54) ELECTROCHEMICAL PROCESSOR ALIGNMENT SYSTEM

(75) Inventor: Bryan Puch, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 625 days.

(21) Appl. No.: 13/267,693

(22) Filed: Oct. 6, 2011

(65) Prior Publication Data

US 2013/0086787 A1 Apr. 11, 2013

(51) Int. Cl.
- *C25D 17/00* (2006.01)
- *H01L 21/67* (2006.01)
- *H01L 21/68* (2006.01)

(52) U.S. Cl.
CPC .......... *C25D 17/001* (2013.01); *H01L 21/6719* (2013.01); *H01L 21/68* (2013.01)
USPC .......................................... 204/248; 205/157

(58) Field of Classification Search
CPC .......... C25D 7/12; C25D 7/126; C25D 17/00; C25D 17/123; C25D 17/001; C25D 21/12; H01L 21/68
USPC .......................................... 204/248; 205/157
See application file for complete search history.

(56) References Cited

U.S. PATENT DOCUMENTS

| | | | |
|---|---|---|---|
| 6,956,223 B2 | 10/2005 | Smick | |
| 7,169,269 B2 | 1/2007 | Mizohata | |
| 7,322,242 B2 | 1/2008 | Merassi | |
| 7,371,306 B2 * | 5/2008 | Davis et al. | 156/345.22 |
| 7,452,568 B2 | 11/2008 | Hougham | |
| 7,815,968 B2 | 10/2010 | Hougham | |
| 2003/0057098 A1 | 3/2003 | Sendai et al. | |
| 2003/0159921 A1 * | 8/2003 | Harris et al. | 204/224 R |
| 2004/0153283 A1 * | 8/2004 | Wargon | 702/156 |
| 2006/0141809 A1 | 6/2006 | Rye et al. | |
| 2007/0080057 A1 | 4/2007 | Mizohata | |
| 2007/0151844 A1 | 7/2007 | Wilson et al. | |
| 2008/0061034 A1 * | 3/2008 | Junn et al. | 216/60 |
| 2008/0180279 A1 | 7/2008 | Hoerl | |
| 2008/0190757 A1 | 8/2008 | Zimmerman | |
| 2009/0067958 A1 * | 3/2009 | van der Meulen | 414/222.13 |

OTHER PUBLICATIONS

U.S. Appl. No. 13/110,728, filed May 18, 2011, McHugh, unpublished.
Korean Intellectual Property Office, International Search Report and Written Opinion for PCT/US2012/052230, Jan. 30, 2013.

* cited by examiner

*Primary Examiner* — Harry D Wilkins, III
*Assistant Examiner* — Ciel Thomas
(74) *Attorney, Agent, or Firm* — Kenneth H. Ohriner; Perkins Coie LLP

(57) ABSTRACT

A substrate plating processor has a vessel on a support structure and a head support fixed in place relative to the support structure. A head having a rotor is attached to the head support. A lifter associated with the head support moves the head into and out of engagement with the vessel. An alignment assembly attachable to the rotor has at least one sensor adapted to detect a position of an inside surface of the vessel when the head is engaged with the vessel. The sensor may be a physical contact sensor positioned to contact the inside surface of the vessel.

12 Claims, 5 Drawing Sheets

ELECTROCHEMICAL PROCESSOR ALIGNMENT SYSTEM

TECHNICAL FIELD

This application relates to chambers, systems, and methods for electrochemically processing micro-feature work pieces or substrates having micro-scale devices integrated in and/or on the substrate.

BACKGROUND

Microelectronic devices, such as semiconductor devices and micro-mechanical or micro-optical devices are generally manufactured on and/or in a substrate using several different types of machines. In a typical manufacturing process, one or more layers of conductive materials, typically metals, are plated onto a substrate The substrate is then generally etched and polished to remove a portion of the deposited conductive layers, to form contacts and/or conductive lines.

As micro-scale devices are increasingly manufactured at ever smaller microscopic sizes, the machines used in the manufacturing processes must also become more precise. When a metal layer plated onto a substrate, generally a highly uniform thickness over all areas of the substrate is required. Achieving a uniform plating profile or thickness requires precise control of electrical current flow in the plating chamber. This correspondingly requires that the substrate be accurately positioned and centered in the plating chamber.

In most plating machines, the substrate is held in a fixture or a rotor in a head which moves the substrate from load/unload position to process position within a plating vessel holding electrolyte. Since the plating chamber is closed when the substrate is in the process position, it is not possible to visually align the substrate, or the head holding the substrate, with the vessel. Accordingly, there is a need for techniques for aligning the head with the vessel in substrate plating chambers.

SUMMARY OF THE INVENTION

A substrate plating processor has a vessel on a support structure and a head support fixed in place relative to the support structure. A head having a rotor is attached to the head support. A lifter associated with the head support, for example in a lift/rotate mechanism, moves the head into and out of engagement with the vessel. An alignment assembly attachable to the rotor has at least one sensor for detecting a position of an inside surface of the vessel when the head is engaged with the vessel. The sensor may be a physical contact sensor positioned to contact the inside surface of the vessel. Other types of sensors, such as optical, acoustic, or other distance measuring sensors may optionally be used. Other and further objects and advantages will become apparent from the following detailed description of one embodiment of the invention. Other embodiments may of course be used within the scope of the invention. The invention resides as well in sub combinations of the elements and steps described.

BRIEF DESCRIPTION OF THE DRAWINGS

In the drawings, the same element number indicates the same element in each of the views.

DETAILED DESCRIPTION

Figure 1:
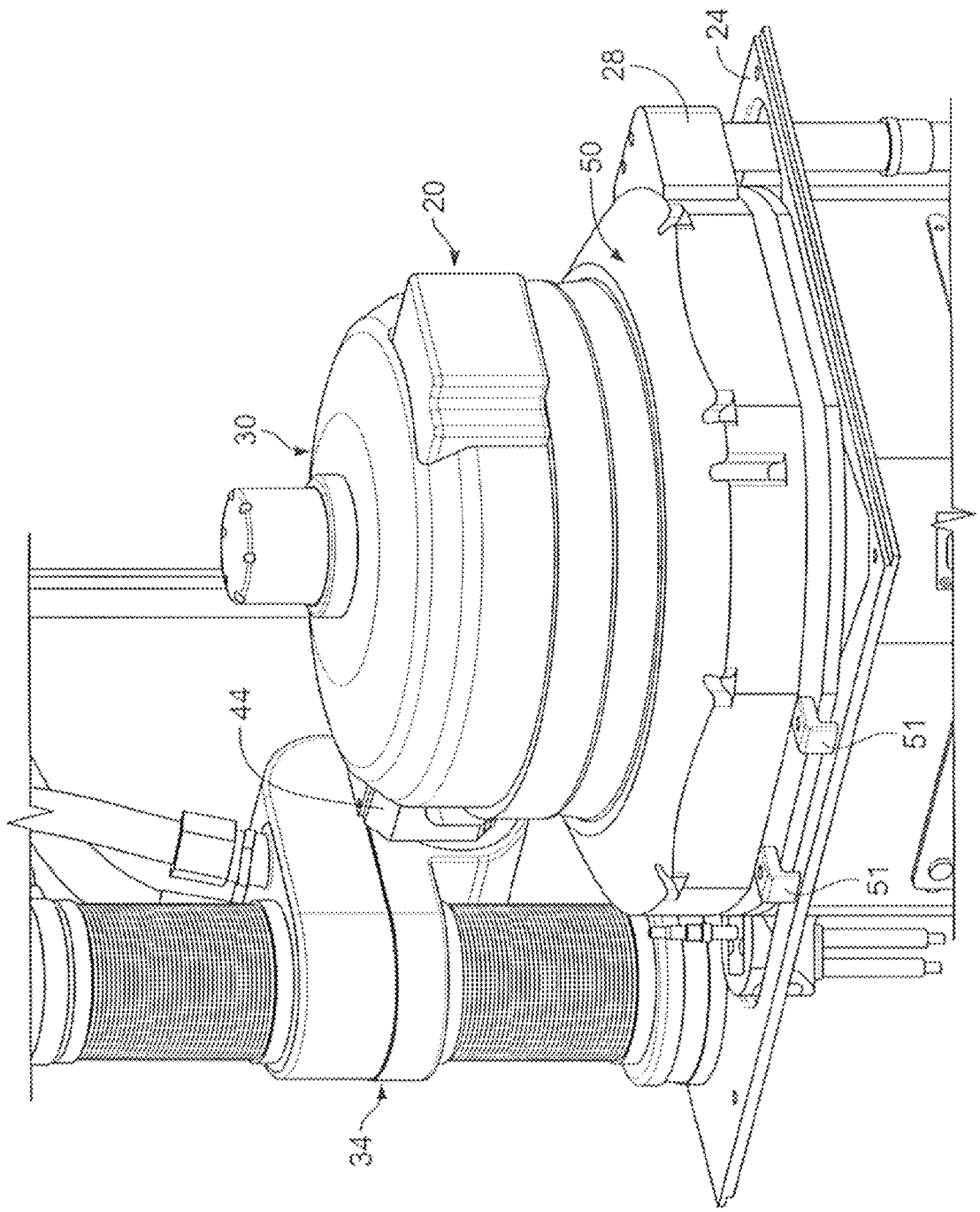
FIG. 1 is a perspective view of a plating chamber.

As shown in FIG. 1, a plating processor or chamber 20 has a head 30 attached to arm 44 of a lift/rotate mechanism 34. The lift/rotate mechanism 34 can vertically lift and lower the head 30, and also rotate the head 30 between a face-up and a face-down position. The head 30 is shown in the face-down position in FIG. 1, with the head 30 also engaged into a vessel assembly 50 supported on a deck plate 24.

Figure 4:
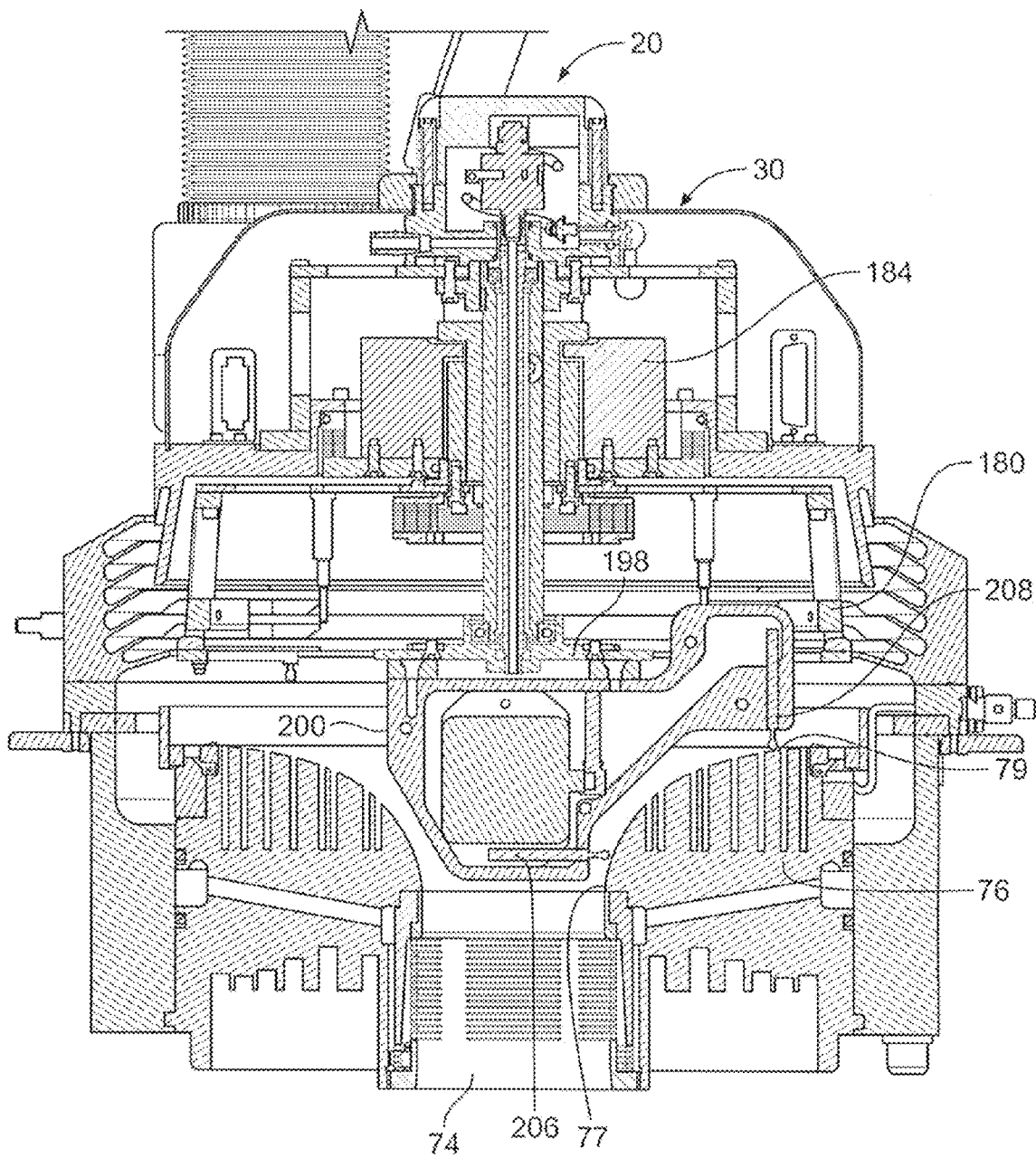
FIG. 4 is a section view of the head shown in FIG. 1.

Referring momentarily to FIG. 4, the head 30 includes a rotor 180 and optionally a backing plate 198 attached to the rotor 180. A motor 184 in the head 30 rotates the rotor 180 during processing. During plating processing, a substrate, such as a silicon wafer, is held in the rotor 180 and rotated while in contact with a liquid electrolyte bath in the vessel assembly 50. A diffuser 74 and an upper cup 76 in the vessel assembly 50 help to control both the electric field and flow of electrolyte within the plating chamber 30. As shown in FIG. 4, when the rotor 180 is in the processing position, the plating chamber 20 is closed, and neither the rotor 180, nor a substrate held in the rotor 180, are visible. Visual alignment between the rotor 180 or the head 30 and the vessel assembly 50 accordingly cannot be achieved.

Figure 5:
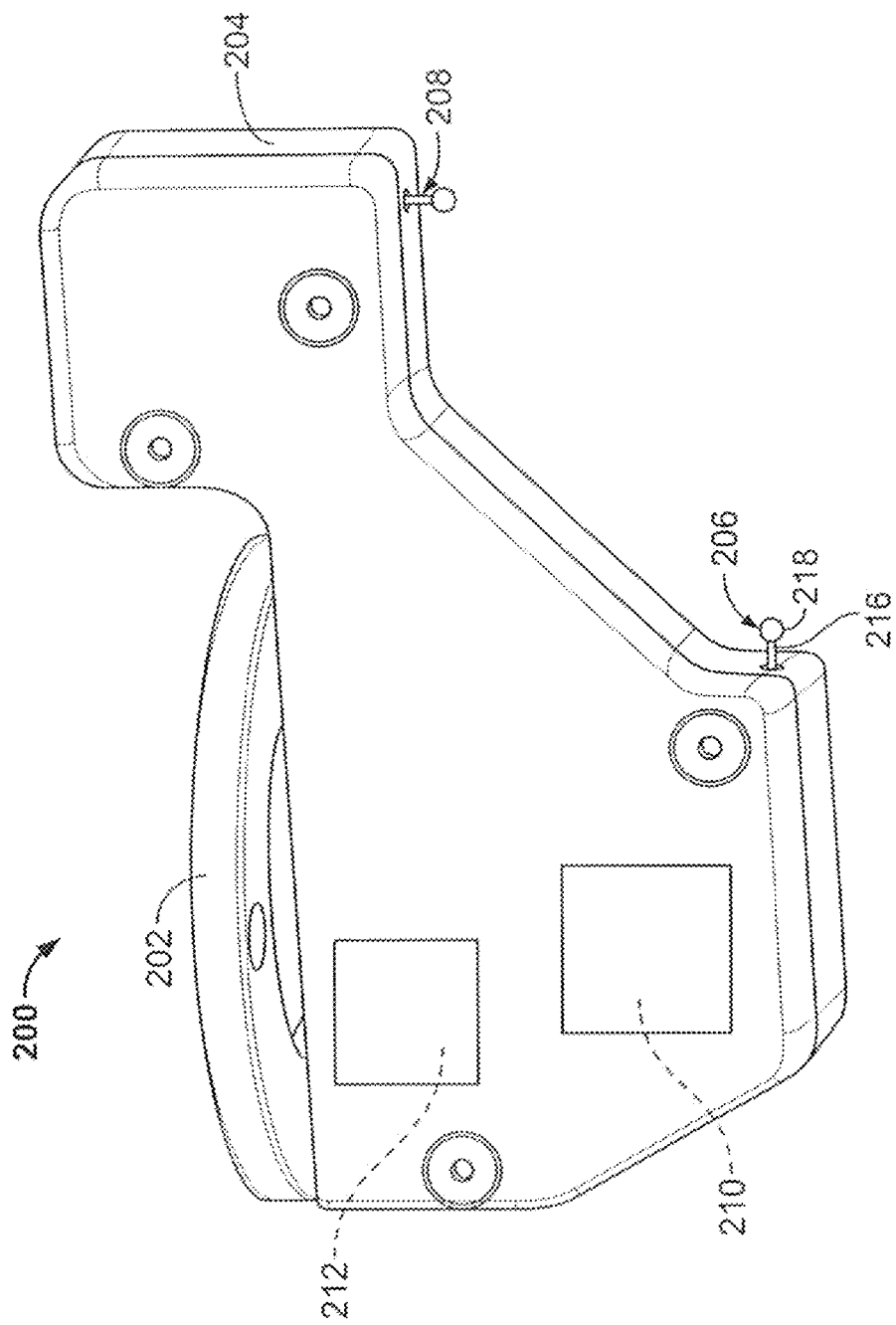
FIG. 5 is a perspective view of the alignment assembly shown in FIG. 4.

FIG. 5 shows an alignment assembly 200 which may be used to precisely align the head 30 including the rotor 180 with the vessel assembly 50. The specific alignment assembly example 200 shown includes first and second alignment position contact sensors 206 and 208. The sensor 206 may be a horizontal position sensor and the sensor 208 may be a vertical position sensor. The sensors 206 and 208 are linked to a transmitter 210 within the alignment assembly housing 204. A battery 212 may also be contained within the housing 204 and linked to the transmitter 210 and to the sensors. The housing 204 may include or be attached to a mounting ring 202. In FIG. 5, the sensors are physical contact sensors oriented at right angles to each other, with the sensor. 208 substantially vertical and the sensor 206 substantially horizontal. In alternative designs, a single sensor, or more than two sensors may be used, and different sensor orientations may be used.

FIG. 4 shows the alignment assembly 200 attached to the rotor 180. Specifically, the mounting ring 202 of the alignment assembly 200 is bolted onto the rotor 180, while the head is in the face-up or load/unload position. If the rotor 180 includes a backing plate 198, it may be removed before attaching the alignment assembly. The head 30 is then inverted and lowered via the lift/rotate mechanism 34 into the process position shown in FIG. 4.

In one method for aligning the head 30 with the vessel assembly 50, the head is first adjusted so that it is level. This may be achieved by first checking the orientation of the head using a digital level or similar manual measuring device. If the measuring device indicates that the head is not level, a first leveling operation may be performed using the manual measuring device and the leveling mechanism described below.

If the digital level indicates the head is level, or after the first leveling operation is performed, a more precise measurement can be made by rotating the alignment assembly 200 within the vessel assembly 50, via control of the motor 184. As the alignment assembly 200 rotates, a readout from the vertical sensor 208 is transmitted to a nearby display, for example via radio frequency transmission. This provides an indication of the out-of-level condition or "sag" of the head, if any.

Figure 2:
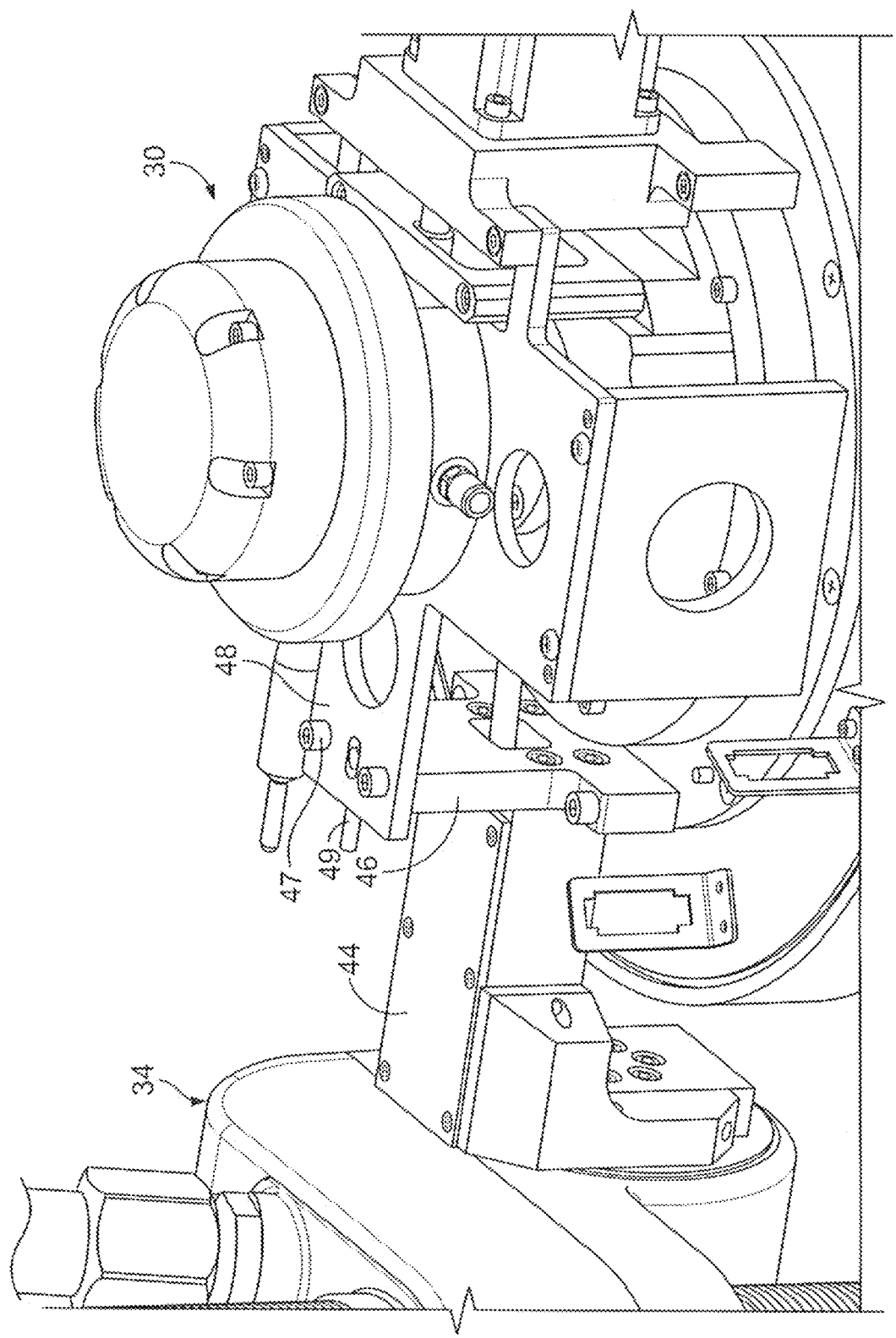
FIG. 2 is a front perspective view of the head of the plating chamber shown in FIG. 1 with the head cover removed for illustration.
Figure 3:
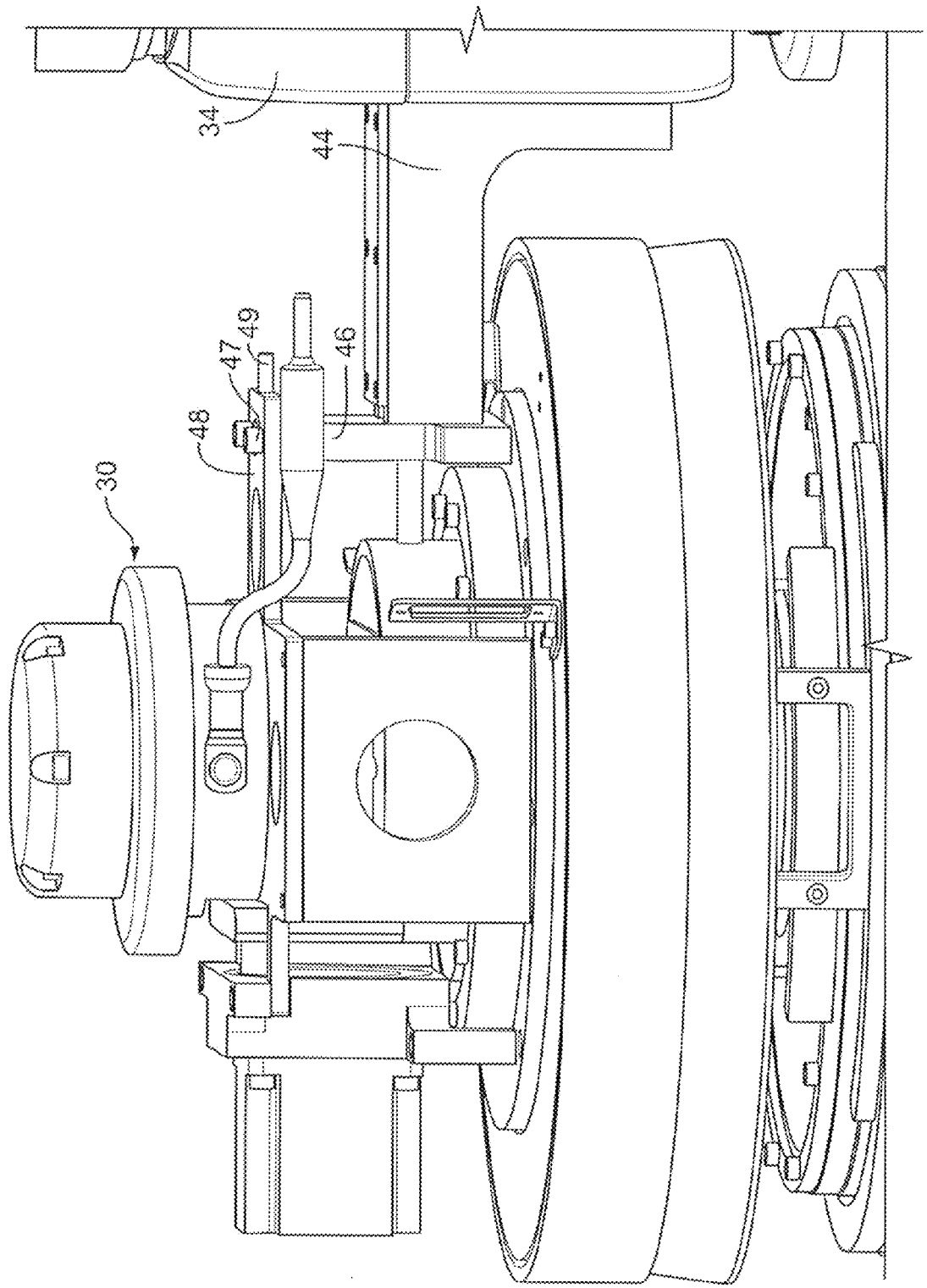
FIG. 3 is a rear perspective view of the head shown in FIG. 2.

Referring to FIGS. 2 and 3, the head 30 may be leveled using a leveling mechanism on the head. Various leveling mechanisms may be used to level the head, generally by exerting a pushing or pulling force between the arm 44 and the head 30. In the example shown in FIGS. 2 and 3, a leveling mechanism operates by loosening locking bolts 47 and then advancing or retracting an adjusting screw 49. The inner end of the adjusting screw 49 bears on an arm plate 46. As the adjusting screw 49 is turned clockwise or tightened, it pulls the head plate 48 up, or clockwise in FIG. 3. The adjusting screw 49 may be turned while monitoring the display of the output of the vertical sensor 208, as the alignment assembly continues to rotate.

After the head 30 is leveled via the adjusting screw 49, the locking bolts are tightened to fix the head 30 into the level position. If the display shows no indication of head sag, then these steps may be skipped as no sag adjustment of the head is necessary. If the digital level measuring device initially shows the head is out of level, then the head leveling steps described above may be performed until the digital leveling device indicates that the head is level, followed by use of the alignment assembly 200, as described above.

With the head 30 level, a readout from the horizontal sensor 206 is used to center the head relative to the vessel assembly 50. This may be achieved by loosening the vessel clamps 51, threaded fasteners, of similar devices which hold the vessel assembly 50 in place on the deck plate 24, as shown in FIG. 1. The vessel assembly 50 may then be shifted horizontally on the deck plate 24, until the readout from the horizontal sensor 206 remains substantially constant through an entire 360 degree rotation. A substantially constant readout from the horizontal sensor indicates that the head is aligned with the vessel assembly 50 about the vertical rotation axis of the rotor. The vessel assembly 50 may be moved horizontally by hand, or by optionally using one or more cam-action or a lever-action tools. The tools, if used, may be hand tools or they may be provided as a permanent part of the processor 20. After the vessel assembly 50 is aligned with the head 30, the clamps 51 are tightened.

The lift/rotate mechanism may then be used to lift the head 30 up and away from the vessel assembly 50, and rotate the head 30 back into a face-up position. The alignment assembly is then removed from the rotor. A substrate may then be loaded into the head and plated. Depending on the specific design of the rotor and the alignment assembly, one or more fixtures, such as contact rings, seal rings, etc. may optionally be attached to the rotor after the alignment assembly is removed and before processing is initiated.

The sensors 206 and 208 may be differential variable reluctance transducer sensors (DVRT). This type of sensor outputs counts proportional to the movement of the tip 218 of the sensor arm 216. For example, a 1 mm movement of the tip may result in an output of 500 counts, with one count equivalent to movement of 0.002 mm. Table 1 below describes one example of an alignment method that may be used.

TABLE 1

1   Initial setup:
   A.   Establish wireless connection to the alignment assembly.
   B.   Verify connection by moving one of the sensors by hand.
   C.   Mount alignment assembly in place of the backing plate.
2   Verify Zero positions:
   A.   Move Lift to upper hard stop (Lift 0 position).

TABLE 1-continued

B.   Move rotate to level ±0.1° with digital level.
   C.   Adjust Sag to level ±0.1° with digital level.
   D.   Spin so R indicator point to lift rotate (Spin 0 position).
3   Level
   A.   Spin to 0°.
   B.   Z down until Z Indicator reads 2000.
   C.   Spin to 180°.
   D.   Adjust Sag to 2000.
   E.   Spin to 90°.
   F.   Adjust Rotate to Z indicator reads 2000.
4   Find Center
   A.   Spin to 0°; record R Axis value (R0).
   B.   Spin to 180°; record R Axis value (R180).
   C.   Calculate Rtarget = (R0 + R180)/2
   D.   Move the vessel until indicator value = Rtarget.
   E.   Spin to 90°; record R Axis value (R90).
   F.   Spin to 270°; record R Axis value (R270).
   G.   Calculate Rtarget = (R90 + R270)/2 (the result should be the same as step C or the center of the vessel is not round.
5   Verify
   Spin 360° to verify Z and Center indicators move less than 100 counts. If either is greater than 100 then iterate starting at step 3.

Thus, novel apparatus and methods have been shown and described. Various changes and substitutions may of course be made without departing from the spirit and scope of the invention. The invention, therefore, should not be limited except by the following claims and their equivalents.

What is claimed is:

1. A substrate plating processor, comprising:
a vessel on a support structure;
a head support fixed in place relative to the support structure;
a head attached to the head support;
a lifter associated with the head support for moving the head into and out of engagement with the vessel;
a rotor on the head rotatable about a rotor axis; and
an alignment assembly attachable to the rotor, with the alignment assembly having at least one physical contact sensor in physical contact with an inside surface of the vessel as the rotor rotates and adapted to detect a position of the inside surface of the vessel relative to the rotor axis, when the head is engaged with the vessel.

2. The substrate plating processor of claim 1 with the vessel including an upper cup having a substantially vertical surface, and with the at least one sensor in physical contact with the substantially vertical surface.

3. The substrate plating processor of claim 1 with the alignment assembly further including a second sensor, and with the vessel including an upper cup having a first surface and a second surface spaced apart from the first surface, and with the first sensor adapted to sense a position of the first surface, and with the second sensor adapted to sense a position of the second surface.

4. The substrate plating processor of claim 3 with the first and second surfaces on an upper cup in the vessel, and with the first surface substantially vertical and the second surface substantially horizontal.

5. The substrate plating processor of claim 4 with the first surface forming an angle of 40 to 90 degrees with the second surface.

6. The substrate plating processor of claim 3 with first and second sensors comprising linear position sensors having a plunger slidable into and out of a housing, and with the plungers movable on substantially perpendicular axes.

7. The substrate plating processor of claim 4 with the upper cup having a curved surface extending between a lower end and an upper end of the upper cup, and with the first surface adjacent to the lower of the upper cup, and the second surface adjacent to the upper end of the cup.

8. The substrate plating processor of claim 1 further comprising a transmitter in the alignment assembly linked to the at least one sensor.

9. The substrate plating processor of claim 1 with the alignment assembly including a mounting plate for temporarily attaching the alignment assembly to the rotor.

10. The substrate plating processor of claim 1 with support structure comprising a deck plate, and further comprising clamping devices locking the vessel in a fixed position on the deck plate, and with the clamping devices releasable to allow the vessel to be moved horizontally relative to the head, to align the vessel with the head.

11. The substrate plating processor of claim 1 further comprising a level adjuster on the head.

12. The substrate plating processor of claim 1 with the inside surface of the vessel contacted by the sensor comprising an upper cup having annular slots for controlling an electric field in the vessel and flow of electrolyte in the vessel.

* * * * *